United States Patent
Yamamoto et al.

(10) Patent No.: US 8,217,722 B2
(45) Date of Patent: Jul. 10, 2012

(54) POWER AMPLIFIER

(75) Inventors: Kazuya Yamamoto, Tokyo (JP); Miyo Miyashita, Tokyo (JP); Satoshi Suzuki, Tokyo (JP); Takayuki Matsuzuka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/079,046

(22) Filed: Apr. 4, 2011

(65) Prior Publication Data
US 2012/0062321 A1    Mar. 15, 2012

(30) Foreign Application Priority Data
Sep. 13, 2010    (JP) ................... 2010-203968

(51) Int. Cl.
*H03F 3/20*    (2006.01)
(52) U.S. Cl. ........................... 330/296; 330/285
(58) Field of Classification Search ............ 330/51, 330/285, 296, 273, 267
See application file for complete search history.

(56) References Cited

U.S. PATENT DOCUMENTS

| | | | |
|---|---|---|---|
| 6,946,913 B2 | 9/2005 | Moriwaki et al. | |
| 7,869,775 B2 * | 1/2011 | Alon et al. | 455/127.1 |
| 8,138,836 B2 * | 3/2012 | Matsuzuka et al. | 330/296 |
| 2007/0159145 A1 | 7/2007 | Liwinski | |
| 2010/0127689 A1 | 5/2010 | Yamamoto et al. | |

FOREIGN PATENT DOCUMENTS

| | | |
|---|---|---|
| JP | 2004-343244 A | 12/2004 |
| JP | 2010-124408 A | 6/2010 |

* cited by examiner

*Primary Examiner* — Hieu Nguyen
(74) *Attorney, Agent, or Firm* — Leydig, Voit & Mayer, Ltd.

(57) ABSTRACT

A power amplifier comprises: an amplifying transistor for amplifying an input signal; a reference voltage generating circuit which generates a reference voltage; a bias circuit generating a bias voltage based on the reference voltage and supplying the bias voltage to the amplifying transistor; and a booster elevating an enable voltage input from outside and outputting the enable voltage. The reference voltage generating circuit is turned ON/OFF in correspondence with an output voltage of the booster. The booster includes: an enable terminal to which the enable voltage is applied; a power source terminal connected to a power source; a transistor having a control electrode connected to the enable terminal, a first electrode connected to the power source terminal, and a second electrode that is grounded; and a FET resistor connected between the first electrode of the transistor and the power source terminal. A gate electrode of the FET resistor is open.

16 Claims, 23 Drawing Sheets

POWER AMPLIFIER

BACKGROUND OF THE INVENTION

1. Field of the Invention

The present invention relates to a power amplifier formed using a BiFET process. More specifically, the present invention relates to a power amplifier capable of suppressing leakage current without increasing chip areas and manufacturing costs.

2. Background Art

Since a conventional GaAs-FET power amplifier has negative threshold voltage, it had a disadvantage that a negative gate bias voltage was required. On the other hand, a GaAs-HBT (hetero junction bipolar transistor) power amplifier does not require negative gate bias voltage, enables single power source operation, and has more even bias characteristics than the FET type. In recent years, therefore, a GaAs-HBT power amplifier has been actively used in mobile telephones such as CDMA or wireless LANs.

Recently, a Bi-FET process for forming a FET on the same substrate for a GaAs-HBT has been increasingly applied to products. Normally, in the case of a GaAs-based Bi-FET process, in addition to a HBT and depletion mode (normally ON) FET is mounted. Furthermore, in the academic conference (IEEE Radio Frequency Integrated Circuits Symposium 2008), a process for fabricating an enhancement-mode FET (normally OFF) on the same substrate in addition to a HBT and a depletion mode FET was reported.

In the Bi-FET power amplifier for mobile telephones, the mounting of ON/OFF functions (enable functions) by an enable voltage has been increasingly standardized. Such a power amplifier had a problem wherein if the threshold voltage of a depletion mode FET is varied, the reference voltage and the collector current is significantly varied. In general, the amplitude of an idle current (a bias current in the state wherein RF input power is absent) in a power amplifier determines the amplitude of linear gain. Therefore, the depression of gain variation due to process variation is one of important issues in designing. The reduction of enable voltage is also required.

In order to solve these problems, a reference voltage generating circuit, wherein the gain variation due to process variation is suppressed, has been proposed (for example, refer to FIG. 1 in Japanese Patent Application Laid-Open No. 2010-124408). Furthermore, a reference voltage generating circuit, wherein the ON voltage of the enable voltage using a depletion mode FET has also been proposed (for example, refer to FIG. 3 in Japanese Patent Application Laid-Open No. 2010-124408).

SUMMARY OF THE INVENTION

Summary of the Invention

FIG. 44 is a diagram showing the relation between the enable voltage and the leakage current of a power amplifier according to the first reference example. The power amplifier is formed by applying the circuit in FIG. 3 of Japanese Patent Application Laid-Open No. 2010-124408 to the reference voltage generating circuit of the power amplifier circuit in FIG. 12 of Japanese Patent Application Laid-Open No. 2010-124408. Specifically, the first reference example operates with a low enable voltage (higher than 1.3 V) by using a low enable voltage type reference voltage generating circuit.

FIG. 45 is a diagram showing the relation between the enable voltage and the leakage current of a power amplifier according to the second reference example. The power amplifier is formed by applying the circuit in FIG. 1 of Japanese Patent Application Laid-Open No. 2010-124408 to the reference voltage generating circuit of the power amplifier circuit in FIG. 12 of Japanese Patent Application Laid-Open No. 2010-124408, and forming a two-step inverter in the front stage of the reference voltage generating circuit. Since the reference voltage generating circuit according to the second reference example corresponds to the enable voltage higher than 2.1 V, the second reference example can be operated with an elevated low enable voltage (higher than 1.3 V) by the inverter.

At present, it is pressed as the specifications of the digital interface of the enable voltage, that the current capacity of an enable terminal is 0.1 mA or less; that the power amplifier is turned OFF (shutdown) when the enable voltage is Low (0 to 0.5 V); and that the power amplifier is turned ON when the enable voltage is High (higher than 1.3 V) and the bias current flows to be an amplification enable state.

Whereas in the example shown in FIG. 44, although the leakage current when the enable voltage is 0 V is good, the leakage current when the enable voltage is 0.5 V becomes larger than in the example shown in FIG. 45. Therefore, if the operation current of an inverter having no shutdown functions is 10 μA and the leakage current of other blocks is sufficiently low, the second reference example is suitable for satisfying the specifications of the enable voltage. In particular, even when the enable voltage is 0.5 V, the leakage current specification for the normally required entire power amplifier at the time of shutdown (lower than 10 μA) can be easily satisfied. However, even at the time of shutdown, the reduction of the current consumed by the continuously operating inverter is important.

In the inverter, if the collector load of the transistor is enlarged, the current can be reduced. However, when the threshold voltage of the transistor is about −0.8 V, it is required to make the collector load be about 100 kΩ to suppress consumed current to several microamperes. Although a thin metal film resistor is normally utilized for a Bi-FET power amplifier for mobile telephones, the sheet resistance thereof is as low as about 30 to 60Ω. Therefore, a significantly large layout area is required for fabricating a thin metal film resistor of 100 kΩ, and the chip size expands. Recently, although there is the case wherein a metal resistor of kΩ order can be utilized, the process step is correspondingly lengthened, and the manufacturing costs elevate.

In view of the above-described problems, an object of the present invention is to provide a power amplifier capable of suppressing leakage current without increasing chip areas and manufacturing costs.

According to the present invention, a power amplifier comprises: an amplifying transistor for amplifying an input signal; a reference voltage generating circuit which generates a reference voltage; a bias circuit generating a bias voltage on the basis of the reference voltage and supplying the bias voltage to the amplifying transistor; and a booster elevating an enable voltage inputted from the exterior and outputting the enable voltage, wherein the reference voltage generating circuit is turned ON/OFF corresponding to an output voltage of the booster, the booster includes: an enable terminal to which the enable voltage is applied; a power source terminal connected to a power source; a transistor having a control electrode connected to the enable terminal, a first electrode connected to the power source terminal, and a second electrode grounded; and a FET resistor connected between the first electrode of the transistor and the power source terminal, wherein a gate electrode of the FET resistor is open.

The present invention makes it possible to suppress leakage current without increasing chip areas and manufacturing costs.

Other and further objects, features and advantages of the invention will appear more fully from the following description.

DETAILED DESCRIPTION OF THE PREFERRED EMBODIMENTS

A power amplifier according to the embodiments of the present invention will be described with reference to the drawings. The same components will be denoted by the same symbols, and the repeated description thereof may be omitted.

First Embodiment

Figure 1:
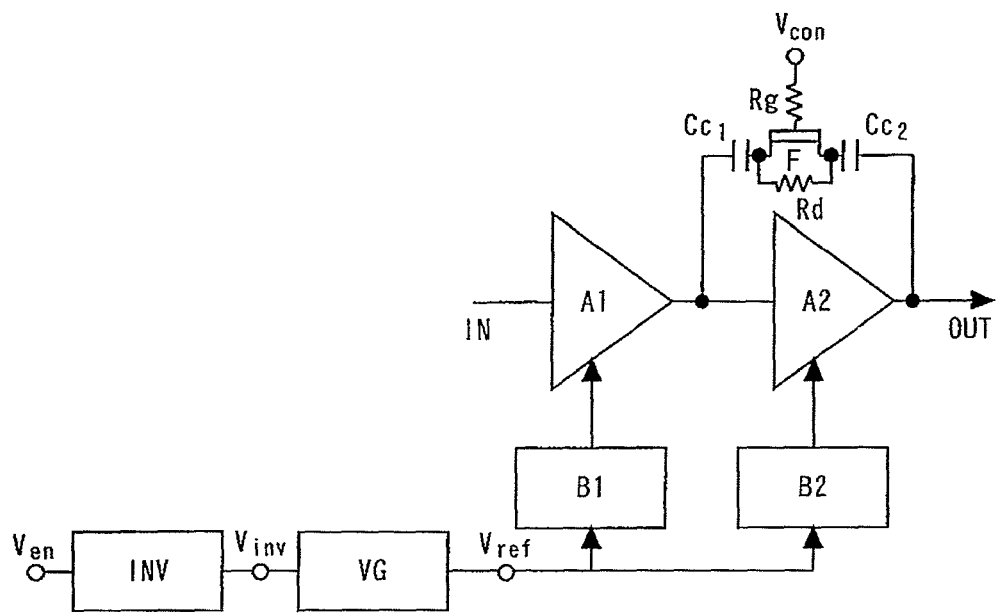
FIG. 1 is a block diagram showing a power amplifier according to the first embodiment.

FIG. 1 is a block diagram showing a power amplifier according to the first embodiment. The power amplifier is formed using a BiFET process for fabricating a FET on the same substrate as the GaAs-HBT, and is equipped with a function for shutdown by an enable voltage inputted from the exterior.

A first-stage amplifying transistor A1 and a second-stage amplifying transistor A2 for amplifying input signals are connected in series. A reference voltage generating circuit VG generates a reference voltage. A first bias circuit B1 and a second bias circuit B2 generate bias voltages on the basis of the reference voltage supplied via a terminal $V_{ref}$ from the reference voltage generating circuit VG, and supply bias voltages to the first-stage amplifying transistor A1 and the second-stage amplifying transistor A2, respectively.

The gate of a switch F for bypassing the second-stage amplifying transistor A2 is connected to a control terminal $V_{con}$ via a resistor Rg; the drain thereof is connected to the input side of the second-stage amplifying transistor A2 via a capacitor $Cc_1$; and the source thereof is connected to the output side of the second-stage amplifying transistor A2 via a capacitor $Cc_2$. A resistor Rd is connected between the source and the drain of the switch F. In the time of low output operation, the operation of the second-stage amplifying transistor A2 is sopped, and the output of the first-stage amplifying transistor A1 is diverted via the switch F and outputted as it is. Thereby, current consumption in the time of low output operation can be reduced.

An inverter INV elevates the enable voltage inputted from the exterior via an enable terminal $V_{en}$ and outputs it from a terminal $V_{inv}$. The reference voltage generating circuit VG is turned ON/OFF corresponding to the output voltage of the inverter INV.

Here, the first-stage amplifying transistor A1 and the second-stage amplifying transistor A2 are composed of GaAs-HBT. On the other hand, FETs are utilized in the first bias circuit B1, the second bias circuit B2, the reference voltage generating circuit VG, the inverter INV, and the switch F. These are formed on the same GaAs substrate.

Figure 2:
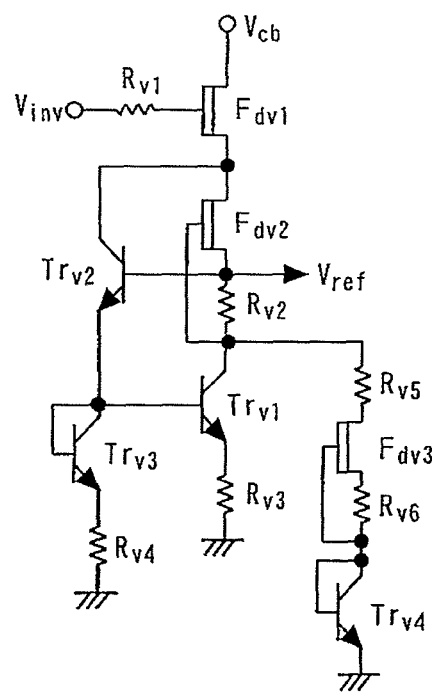
FIG. 2 is a circuit diagram showing a reference voltage generating circuit according to the first embodiment.

FIG. 2 is a circuit diagram showing a reference voltage generating circuit according to the first embodiment. The symbol $V_{cb}$ denotes a power source terminal connected to the power source, $V_{en}$ denotes an enable terminal to which an enable voltage is applied, and $V_{ref}$ denotes a reference voltage terminal to which a reference voltage is applied. Symbols $F_{dv1}$ to $F_{dv3}$ denote depression mode FETs, $Tr_{v1}$ to $Tr_{v4}$ denote HBTs, and $R_{v1}$ to $R_{v6}$ denote resistors.

Figure 3:
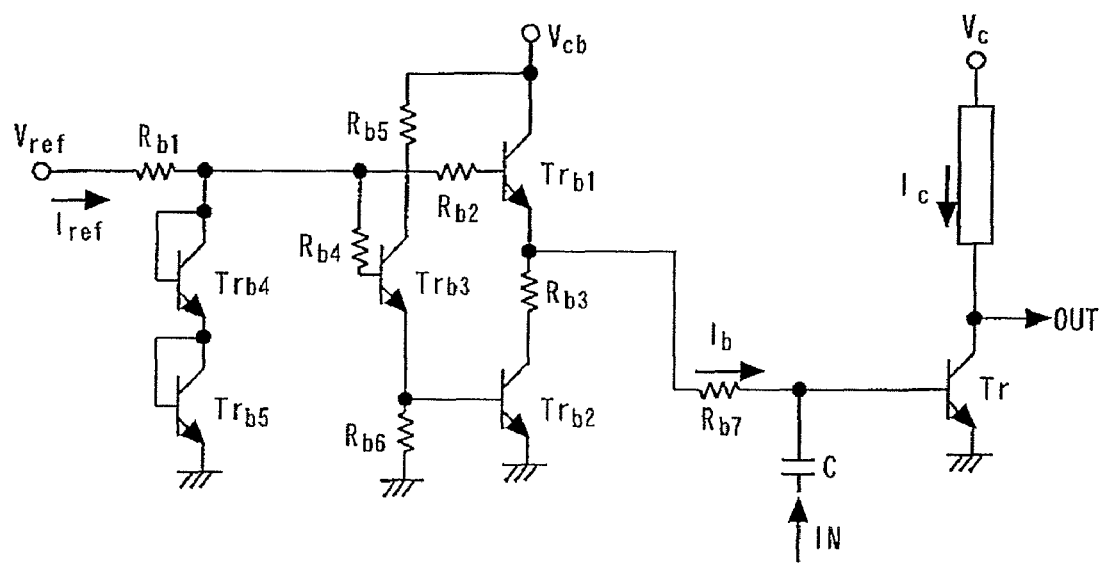
FIG. 3 is a circuit diagram showing a bias circuit according to the first embodiment.

FIG. 3 is a circuit diagram showing a bias circuit according to the first embodiment. $V_c$ denotes a power terminal connected to the power source; Tr, and $Tr_{b1}$ to $Tr_{b5}$ denote HBTs; $R_{b1}$ to $R_{b7}$ denote resistors; and C denotes a capacitor.

Figure 4:
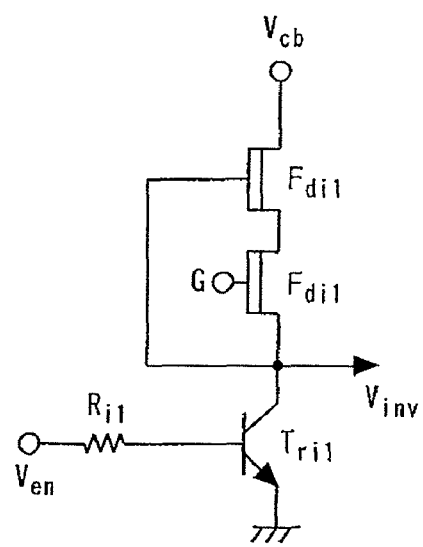
FIG. 4 is a circuit diagram showing an inverter according to the first embodiment.

FIG. 4 is a circuit diagram showing an inverter according to the first embodiment. Symbols $F_{di1}$ and $F_{di2}$ depression mode FETs, $Tr_{i1}$ denotes an HBT, and $R_{i1}$ denotes a resistor. The base of $T_{ri1}$ is connected to the enable terminal $V_{en}$ via $R_{i1}$. The collector of $Tr_{i1}$ is connected to the power source terminal $V_{cb}$. The emitter of $Tr_{i1}$ is grounded. Output signals are outputted from the collector side of $Tr_{i1}$ via the terminal $V_{inv}$.

$F_{di1}$ and $F_{di2}$ are connected in series between the collector of $Tr_{i1}$ and the power source terminal $V_{cb}$. The gate of $F_{di1}$ is connected to the source of $F_{di2}$. $F_{di2}$ is a FET resistor whose gate electrode G is open.

Figure 5:
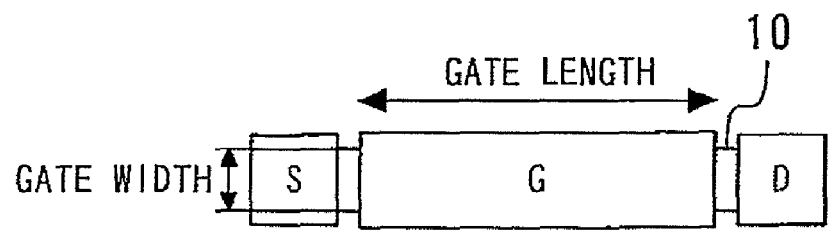
FIG. 5 is a top view showing a FET resistor according to the first embodiment.

FIG. 5 is a top view showing a FET resistor according to the first embodiment. A source electrode S and a drain electrode D are ohmically connected to the impurity diffused region 10, and a gate electrode G is Schottky connected to the impurity diffused region 10 between them. The FET resistor $F_{di2}$ is a long channel, and the gate width and the gate length thereof are about 3 to 4 µm and at least 40 µm, respectively. The gate electrode G is not electrically connected to other circuits or wirings, and is kept open.

Figure 6:
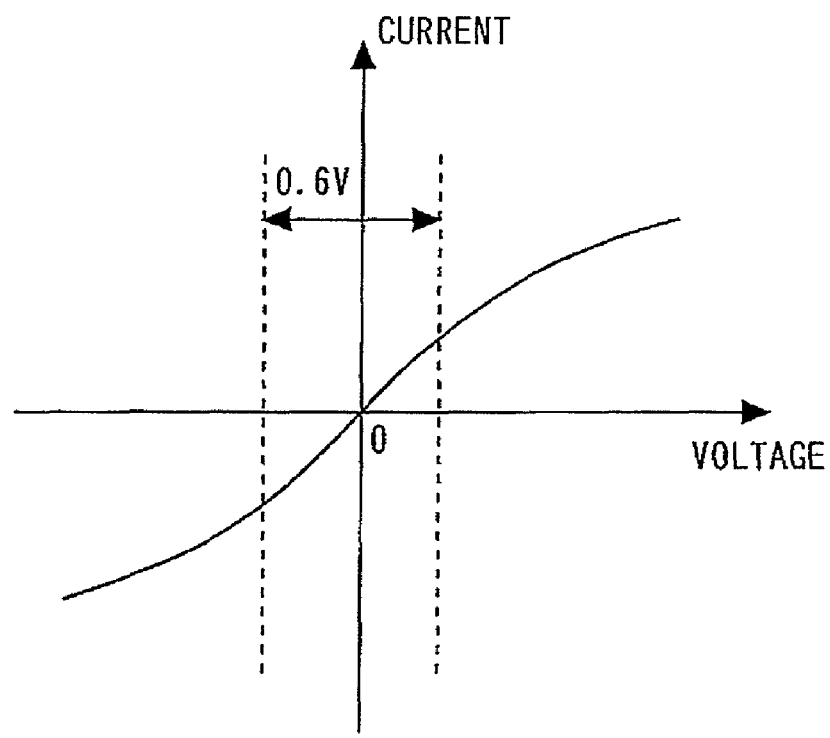
FIG. 6 is a diagram showing the DC characteristics of the FET resistor according to the first embodiment.

FIG. 6 is a diagram showing the DC characteristics of the FET resistor according to the first embodiment. The DC characteristics of the FET resistor have a significantly strong nonlinearity and the linear region is as narrow as about ±0.3V. However, in the FET of a threshold voltage of −0.8 V and a saturated current density of 200 mA/mm, the sheet resistance of the linear region is as high as 700Ω to 1 kΩ. Therefore, when the FET resistor is used, a high resistance of about 100 kΩ can be realized in a chip area several tens of times smaller than the case where a thin metal film resistor having a sheet resistance of several ohms is used. Since the addition of steps for forming the high sheet metal resistor to the normal BiFET process, the manufacturing costs are not increased.

Figure 45:
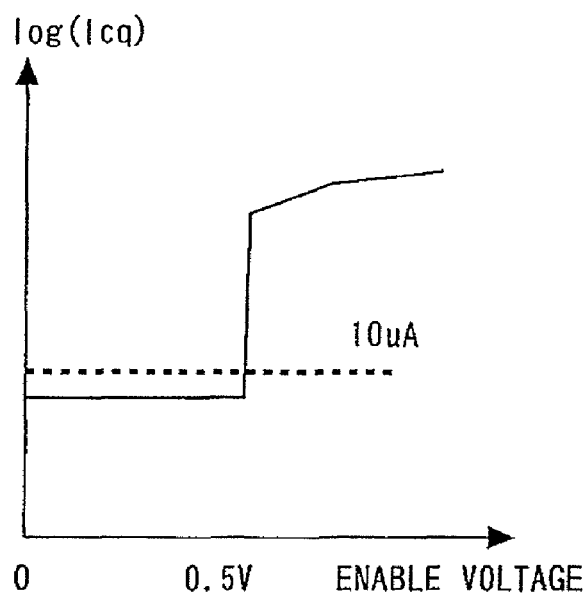
FIG. 45 is a diagram showing the relation between the enable voltage and the leakage current of a power amplifier according to the second reference example.

In the present embodiment, as described above, a gate open long-channel FET resistor that can be fabricated without adding process steps is used as the resistor of the inverter. Thereby, as shown in FIG. 45, the leakage current of the entire power amplifier can be suppressed to several µA or less (about 0.1 µA to 5 µA) at a wide Low level of the enable voltage of 0 to 0.8 V without increasing the chip area and manufacturing costs.

Figure 7:
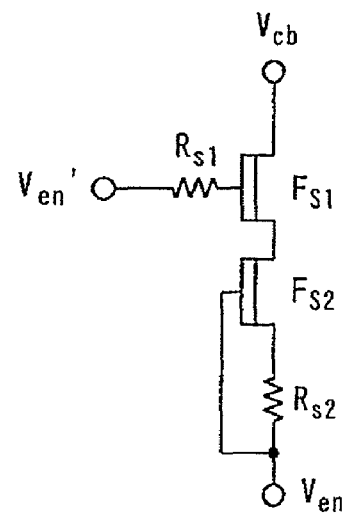
FIG. 7 is a circuit diagram showing an input circuit according to the first embodiment.

FIG. 7 is a circuit diagram showing an input circuit according to the first embodiment. $V_{en}'$ denotes a terminal to which the enable voltage is inputted, $F_{s1}$ and $F_{s2}$ denote depression mode FETs, and $R_{s1}$ and $R_{s2}$ denote resistors. Since the $Tr_{i1}$ of the inverter INV is HBT, it is not turned ON without applying the enable voltage higher than 1.4 V to the base. In order to turn it ON by the enable voltage of 0.8 V or higher and 1.4 V or lower, normally the input circuit shown in FIG. 7 is connected to the front stage of the terminal $V_{en}$ of the inverter INV to elevate the enable voltage. This is identical to the inverter INV in other embodiments.

Second Embodiment

Figure 8:
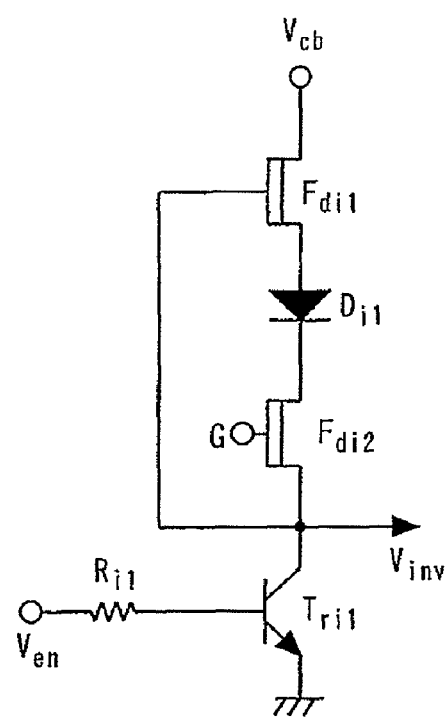
FIG. 8 is a circuit diagram showing an inverter according to the second embodiment.

FIG. 8 is a circuit diagram showing an inverter according to the second embodiment. In this circuit, a diode $D_{i1}$ is added to the inverter in the first embodiment. The diode $D_{i1}$ is connected between $F_{di1}$ and $F_{di2}$. The diode $D_{i1}$ is a Schottky diode formed between the gate and source, and between the gate and drain of a FET, and the ON voltage thereof is about 0.6 to 0.7V. The resistance value of $F_{di2}$ can be reduced by the ON voltage (to about ½). When the threshold voltage of the depletion mode FET is deeper than the ON voltage of the diode $D_{i1}$ (for example, when the threshold voltage is −0.8V), the circuit is effectively operated. In addition, the effect in the first embodiment can also be achieved.

Third Embodiment

Figure 9:
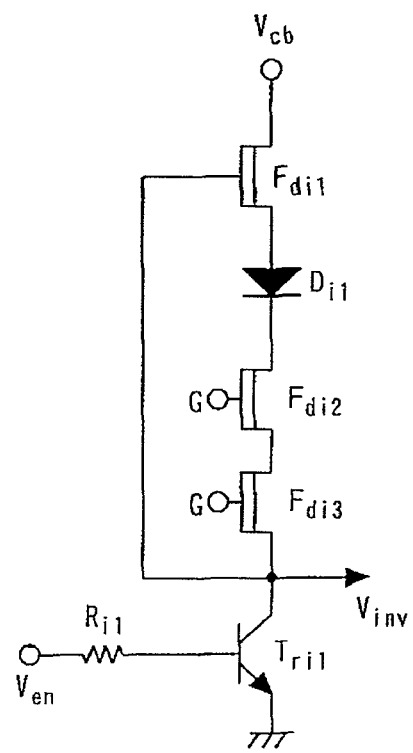
FIG. 9 is a circuit diagram showing an inverter according to the third embodiment.

FIG. 9 is a circuit diagram showing an inverter according to the third embodiment. In this circuit, a FET resistor $F_{di3}$ formed by opening the gate of the depletion mode FET is added to the inverter in the second embodiment. $F_{di2}$ and $F_{di3}$ are connected in series.

Figure 10:
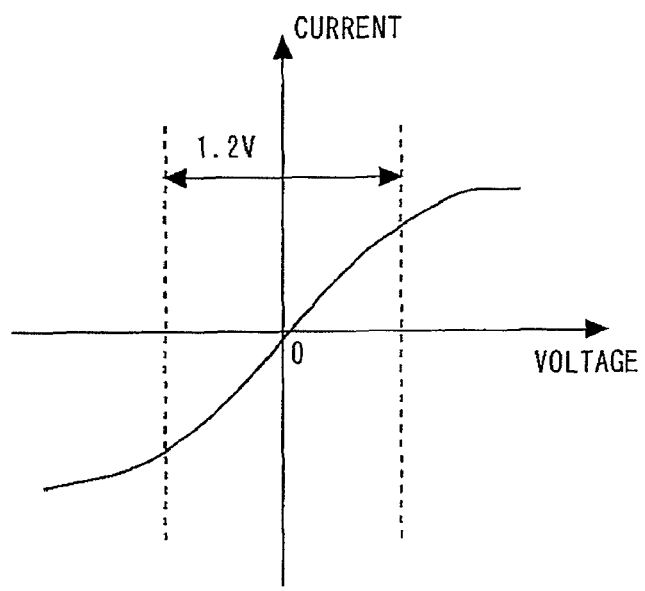
FIG. 10 is a diagram showing the DC characteristics of two FET resistors connected in series according to the third embodiment.

FIG. 10 is a diagram showing the DC characteristics of two FET resistors connected in series according to the third embodiment. Since the range of linear operation is expanded to about 1.2 V, as described above, this embodiment is especially effective when the FET resistor is used in line in a wide voltage range. In addition, the effect in the second embodiment can also be achieved.

Fourth Embodiment

Figure 11:
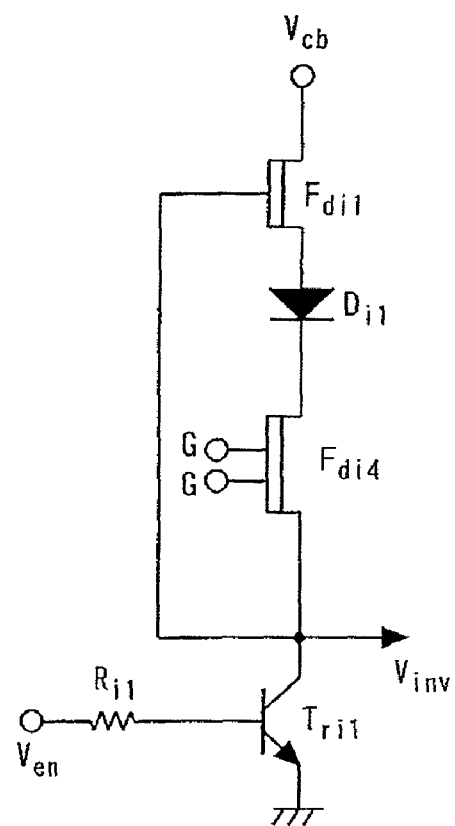
FIG. 11 is a circuit diagram showing an inverter according to the fourth embodiment.
Figure 12:
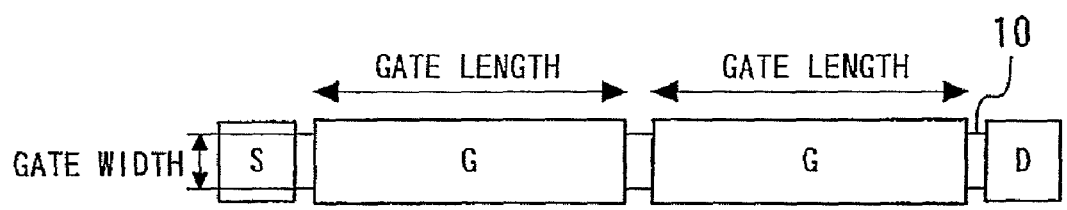
FIG. 12 is a top view showing a FET resistor according to the fourth embodiment.

FIG. 11 is a circuit diagram showing an inverter according to the fourth embodiment. FIG. 12 is a top view showing a FET resistor according to the fourth embodiment. In this circuit, two FET resistors $F_{di2}$ and $F_{di3}$ connected in series in the third embodiment are replaced by one FET resistor $F_{di4}$ having a dual gate. In this case, as in the third embodiment, the linear operation range is expanded to about 1.2 V. The installation of the source electrode S and the drain electrode D is not required between two gate electrodes G, the size can be reduced compared to the third embodiment. In addition, the effect in the second embodiment can also be achieved.

Fifth Embodiment

Figure 13:
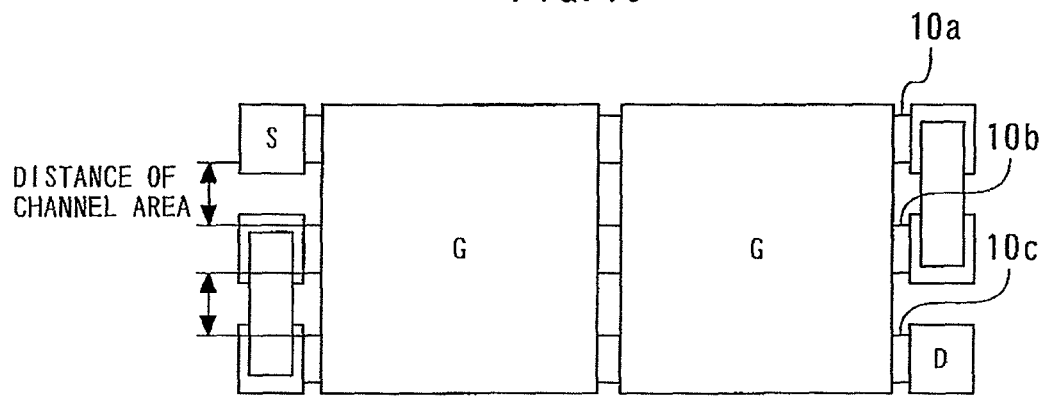
FIG. 13 is a top view showing a FET resistor according to the fifth embodiment.

FIG. 13 is a top view showing a FET resistor according to the fifth embodiment. Three impurity diffused regions 10a, 10b, and 10c are formed in parallel on a GaAs substrate. Gate electrodes G are Schottky-connected to the impurity diffused regions 10a, 10b, and 10c to form three FET resistors. These FET resistors are connected in series. The gate electrodes G of the three FET resistors are joined to one another. In the present invention, since the gate electrodes of the FET resistors are opened, the gate electrodes G of the FET resistors can be joined.

Figure 14:
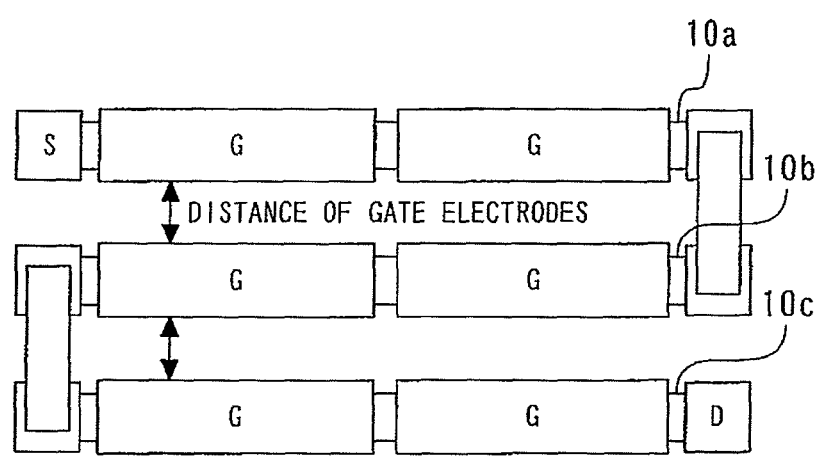
FIG. 14 is a top view showing the FET resistor according to the comparative example.

The effect of the fifth embodiment will be described by comparing with the comparative example. FIG. 14 is a top view showing the FET resistor according to the comparative example. In the comparative example, the gate electrodes G of three FET resistors are separated. Therefore, the process standard of the distance of the gate electrodes G limits the pattern miniaturization in the time of layout. On the other hand, in the fifth embodiment, the distance between the gate electrodes G does not limit the pattern miniaturization, and only the distance between the impurity diffused regions limits the pattern miniaturization. Therefore, the layout of the FET resistors can be miniaturized.

Sixth Embodiment

Figure 15:
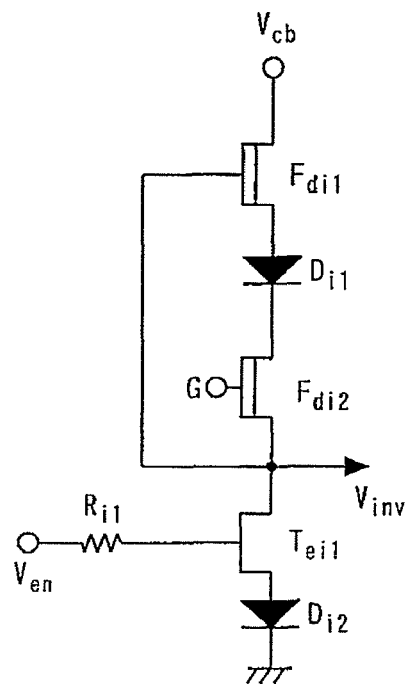
FIG. 15 is a circuit diagram showing an inverter according to the sixth embodiment.

FIG. 15 is a circuit diagram showing an inverter according to the sixth embodiment. In this circuit, $Tr_1$ of the inverter in the sixth embodiment is replaced by $F_{ei1}$, which is an enhancement-mode FET, and a Schottky diode $D_{i2}$. $D_{i2}$ is connected between the source and the grounding point.

In recent BiFET process, not only depletion-mode FETs, but also the enhancement-mode FETs can be fabricated. The present embodiment can be applied to such a BiFET process. $D_{i2}$ is effective for the leakage current in the time when $F_{ei1}$ is turned OFF. In addition, the effect in the second embodiment can also be achieved.

Seventh Embodiment

Figure 16:
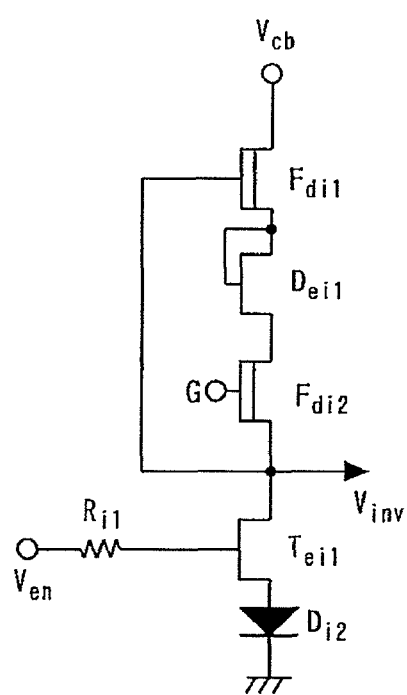
FIG. 16 is a circuit diagram showing an inverter according to the seventh embodiment.

FIG. 16 is a circuit diagram showing an inverter according to the seventh embodiment. In this circuit, the Schottky diode $D_{i1}$ of the inverter in the sixth embodiment is replaced with $D_{ei1}$ that is a diode-connected enhancement-mode FET. Since the threshold voltage of the enhancement-mode FET is normally as low as 0.2 to 0.3 V, delicate voltage design compared with the Schottky diode becomes feasible.

When the threshold voltage of $F_{di2}$ that is the depletion-mode FET is lower than the ON voltage of the Schottky diode $D_{i1}$ (for example, when the threshold voltage is 0.4 to –0.6 V), the present embodiment is particularly effective for reducing current consumption and resistance value. In addition, the effect in the sixth embodiment can also be achieved.

Eighth Embodiment

Figure 17:
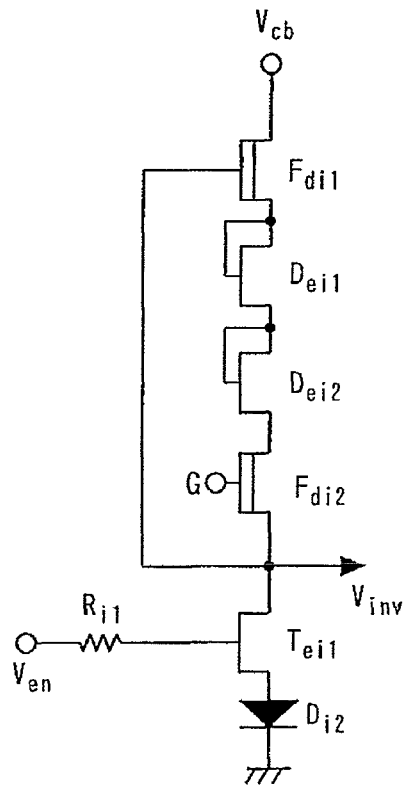
FIG. 17 is a circuit diagram showing an inverter according to the eighth embodiment.

FIG. 17 is a circuit diagram showing an inverter according to the eighth embodiment. In this circuit, the Schottky diode $D_{i1}$ of the inverter in the sixth embodiment is replaced with two diode-connected enhancement-mode FETs $D_{ei1}$ and $D_{ei2}$ connected in series. When the threshold voltage of a depletion-mode FET $F_{di2}$ is about –0.6 V, the present embodiment is particularly effective for reducing current consumption and resistance values. In addition, the effect in the sixth embodiment can also be achieved.

Ninth Embodiment

Figure 18:
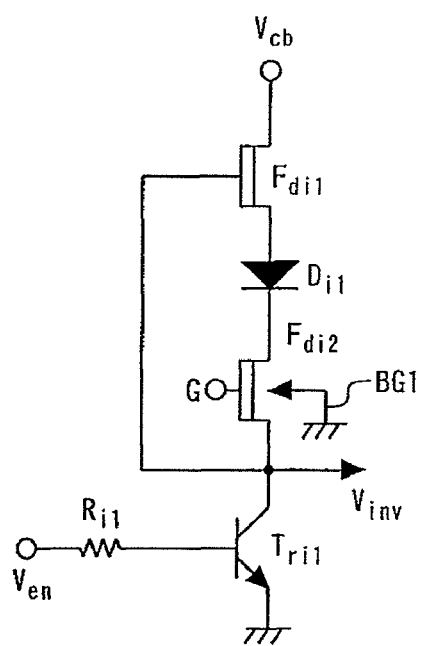
FIG. 18 is a circuit diagram showing an inverter according to the ninth embodiment.

FIG. 18 is a circuit diagram showing an inverter according to the ninth embodiment. In this circuit, a grounded back-gate electrode BG1 is connected immediately under the FET resistor $F_{di2}$ of the inverter in the second embodiment.

Figure 19:
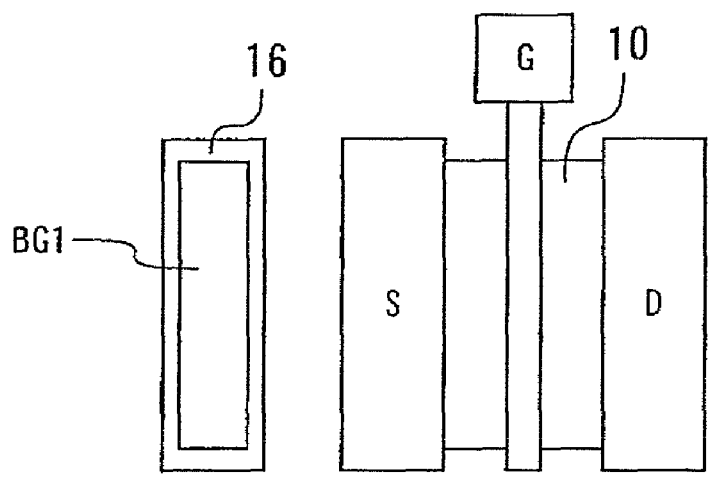
FIG. 19 is a top view showing a FET resistor according to the ninth embodiment.
Figure 20:
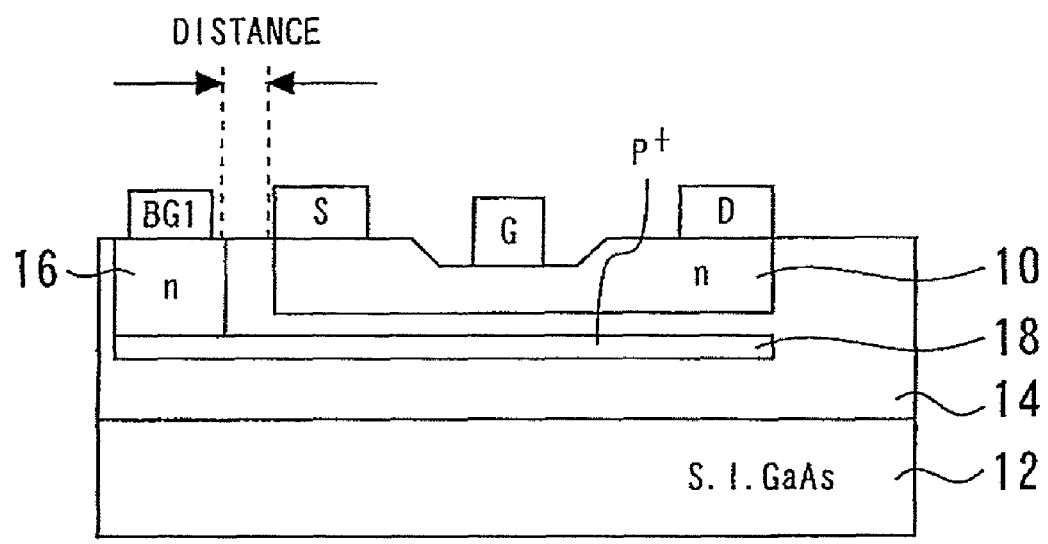
FIG. 20 is a sectional view showing the FET resistor according to the ninth embodiment.

FIG. 19 is a top view showing a FET resistor according to the ninth embodiment. FIG. 20 is a sectional view showing the FET resistor according to the ninth embodiment. A GaAs buffer layer 14 is formed on a semi-insulating GaAs substrate 12. In the vicinity of the surface of the GaAs buffer layer 14, n-type impurity diffused regions 10 and 16 are formed. A p+-type layer 18 is formed immediately under the impurity diffused region 10 in the GaAs buffer layer 14, and the p+-type layer 18 is connected to the impurity diffused region 16. On the impurity diffused region 10, a source electrode S, a drain electrode D, and a gate electrode G are formed. On the impurity diffused region 16, a back-gate electrode BG1 is formed. The back-gate electrode BG1 is connected to the p+-type layer 18 immediately under the FET resistor $F_{di2}$ via the impurity diffused region 16. A back-surface electrode of the chip may be the back-gate electrode BG1.

Figure 21:
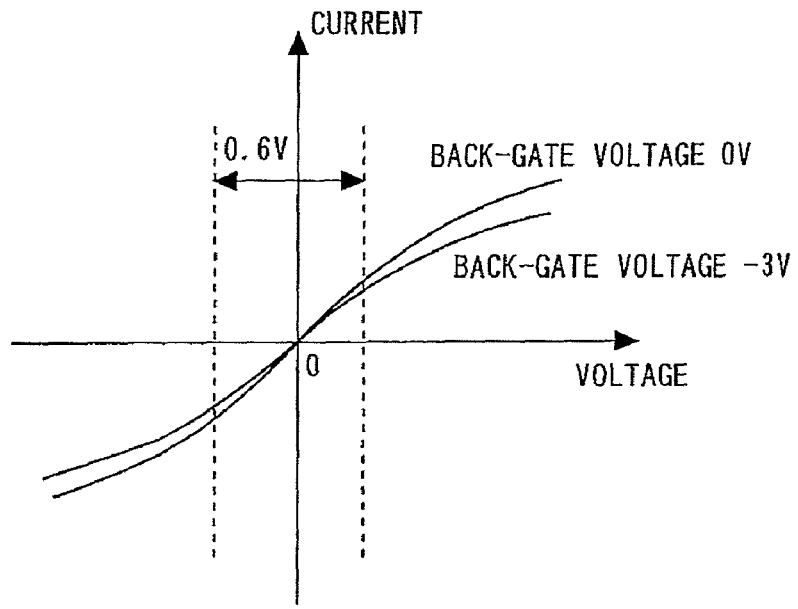
FIG. 21 is a diagram showing the DC characteristics of the FET resistor according to the ninth embodiment.

FIG. 21 is a diagram showing the DC characteristics of the FET resistor according to the ninth embodiment. It is known that the resistance value of the FET resistor is different between when the back-gate voltages applied to the back-gate electrode BG1 is 0 V and when it is –3 V. In the process for the epitaxial growth of the GaAs buffer layer 14 on the semi-insulating GaAs substrate 12, crystal defects are introduced. The channel resistor of the FET is affected by the back-gate voltage via the level of the crystal defects. Therefore, the resistance value of the FET resistor is different corresponding to the back-gate voltage as described above.

Since the potential of the FET resistor is normally higher than 0 V, if the back-gate voltage is 0 V, the back-gate voltage relatively becomes negative. Thereby, the resistance value of the FET resistor can be elevated, and the layout of the FET resistor can be correspondingly reduced. The effect for elevating the resistance value is about 10 to 30% within the normal voltage range (about 0 to –3 V). In addition, the effect in the second embodiment can also be achieved.

Figure 22:
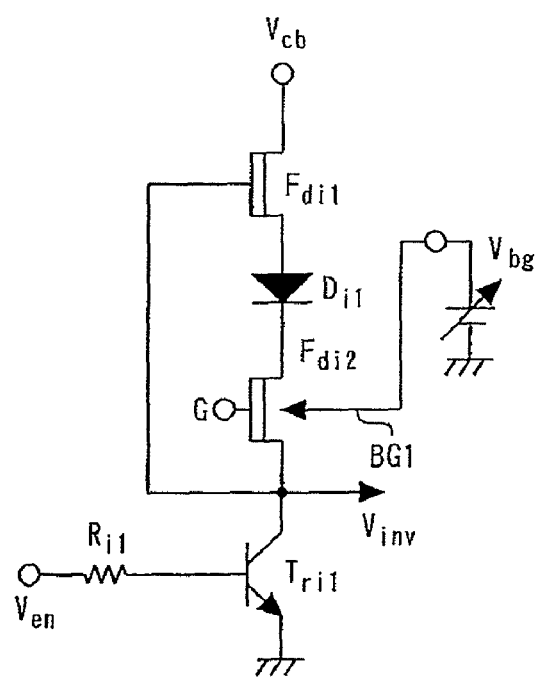
FIG. 22 is a circuit diagram showing an modified form of the inverter according to the eighth embodiment.

FIG. 22 is a circuit diagram showing an modified form of the inverter according to the eighth embodiment. The back-gate voltage is made to be variable. Thereby, the resistance value of the FET resistor can be controlled to a desired value after fabricating the chip.

Tenth Embodiment

Figure 23:
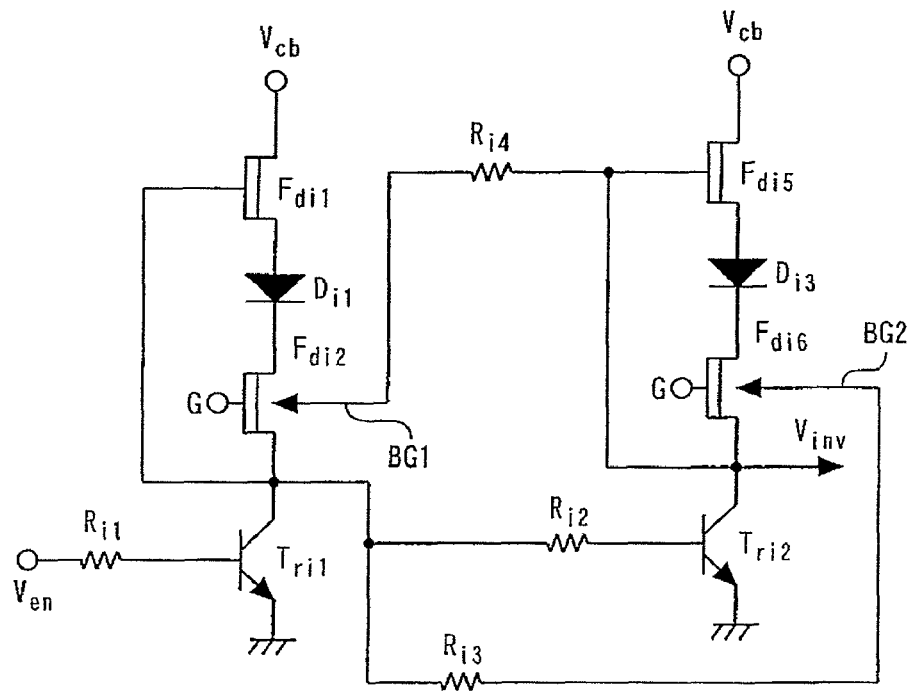
FIG. 23 is a circuit diagram showing an inverter according to the tenth embodiment.

FIG. 23 is a circuit diagram showing an inverter according to the tenth embodiment. Two stages of inverters are formed. $F_{di5}$ and $F_{di6}$ denote depletion-mode FETs; $T_{ri2}$ denotes a HBT; $R_{i2}$ to $R_{i4}$ denote resistors; and $D_{i3}$ denotes a Schottky diode. The base of $Tr_{i2}$ is connected to the collector of $Tr_{i1}$ via $R_{i2}$. The collector of $T_{ri2}$ is connected to a power terminal $V_{cb}$. The emitter of $T_{ri2}$ is grounded. Output signals are outputted from the collector side of $Tr_{i2}$ via a terminal $V_{inv}$.

$F_{di5}$ and $F_{di6}$ are connected in series between the collector of $T_{ri2}$ and the power terminal $V_{cb}$. The gate of $F_{di5}$ is connected to the source of $F_{di6}$. $F_{di6}$ is a FET resistor having an open gate electrode G. The diode $D_{i3}$ is connected between $F_{di5}$ and $F_{di6}$.

A back-gate electrode BG1 is connected immediately under a FET resistor $F_{di2}$, and a back-gate electrode BG2 is connected immediately under the FET resistor $F_{di6}$. The collector of $Tr_{i1}$ is connected to the back-gate electrode BG2 via a resistor $R_{i3}$, and the collector of $Tr_{i2}$ is connected to the back-gate electrode BG1 via a resistor $R_{i4}$. Thereby, the back-gate voltage can be applied to the FET resistors $F_{di2}$ and $F_{di6}$ without preparing separate power sources.

Figure 24:
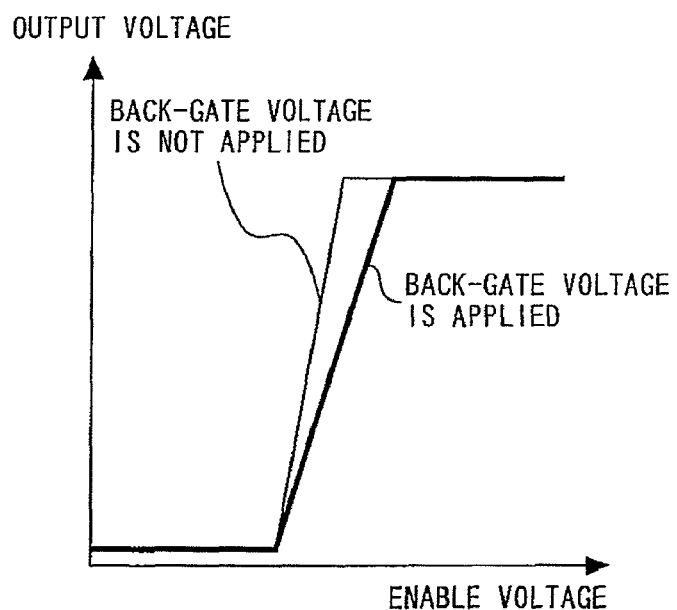
FIG. 24 is a diagram showing the relationship between the output voltage and the enable voltage of the inverter according to the tenth embodiment.
Figure 25:
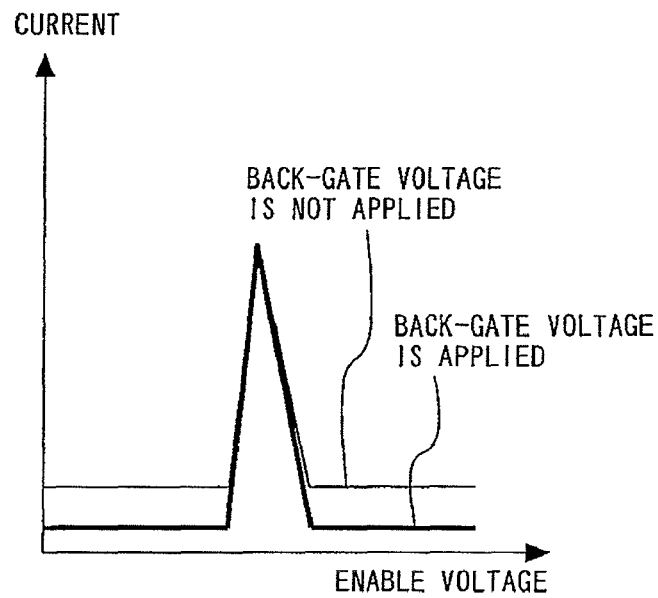
FIG. 25 is a diagram showing the relationship between the current and the enable voltage of the inverter according to the tenth embodiment.

FIG. 24 is a diagram showing the relationship between the output voltage and the enable voltage of the inverter according to the tenth embodiment. FIG. 25 is a diagram showing the relationship between the current and the enable voltage of the inverter according to the tenth embodiment. Since a low back-gate voltage is applied to the FET resistor of the inverter in the OFF state, the FET resistance when the enable voltage is changed from Low to High is slightly elevated. Therefore, although the response time is longer compared with the case where no back-gate voltage is applied, current consumption can be reduced.

Eleventh Embodiment

Figure 26:
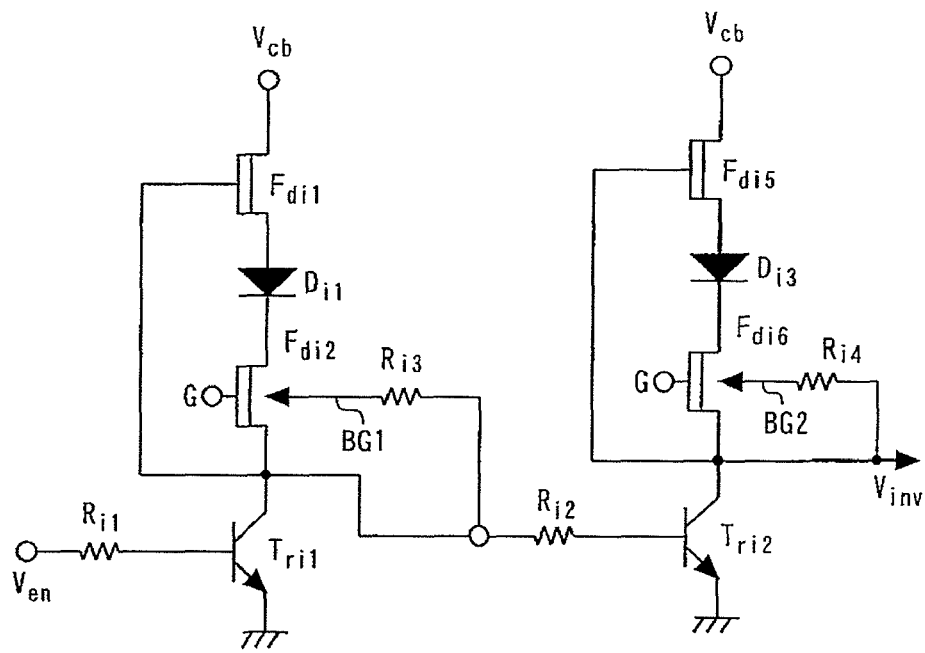
FIG. 26 is a circuit diagram showing an inverter according to the eleventh embodiment.

FIG. 26 is a circuit diagram showing an inverter according to the eleventh embodiment. Different from the tenth embodiment, the collector of $Tr_{i1}$ is connected to a back-gate electrode BG1 via a resistor $R_{i3}$, and the collector of $Tr_{i2}$ is connected to a back-gate electrode BG2 via a resistor $R_{i4}$. Thereby, in the same manner as in the tenth embodiment, the back-gate voltage can be applied to FET resistors $F_{di2}$ and $F_{di6}$ without preparing the separate power source.

Figure 27:
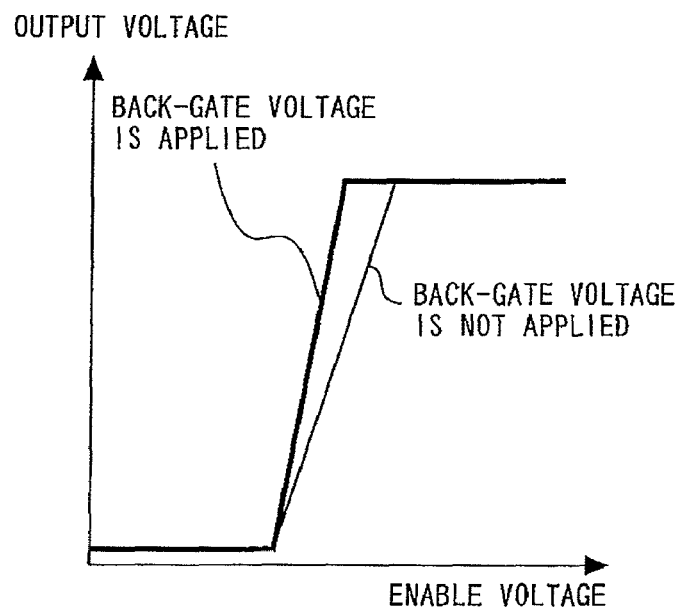
FIG. 27 is a diagram showing the relationship between the output voltage and the enable voltage of the inverter according to the eleventh embodiment.
Figure 28:
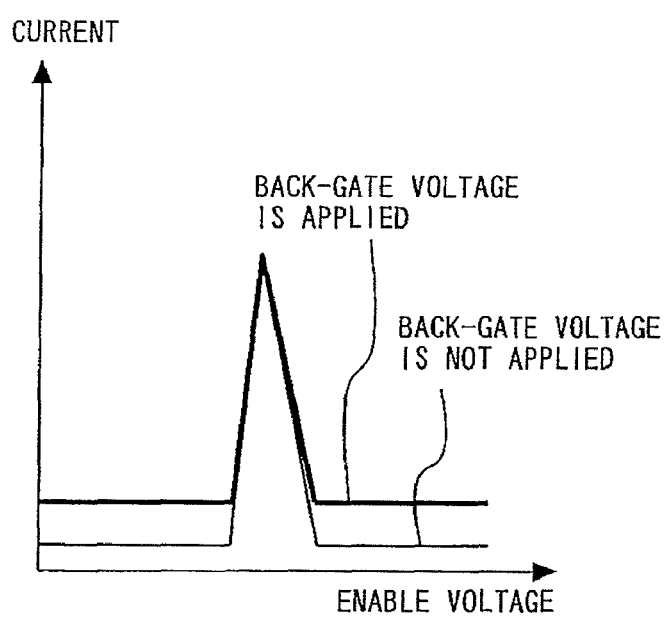
FIG. 28 is a diagram showing the relationship between the current of the inverter and the enable voltage according to the eleventh embodiment.

FIG. 27 is a diagram showing the relationship between the output voltage and the enable voltage of the inverter according to the eleventh embodiment. FIG. 28 is a diagram showing the relationship between the current of the inverter and the enable voltage according to the eleventh embodiment. Since a low back-gate voltage is supplied to the FET resistor of the inverter in the ON state, the FET resistance when the enable voltage is changed from Low to High is slightly lowered. Therefore, although current consumption is increased compared with the case where no back-gate voltage is applied, response time can be shortened.

Twelfth Embodiment

Figure 29:
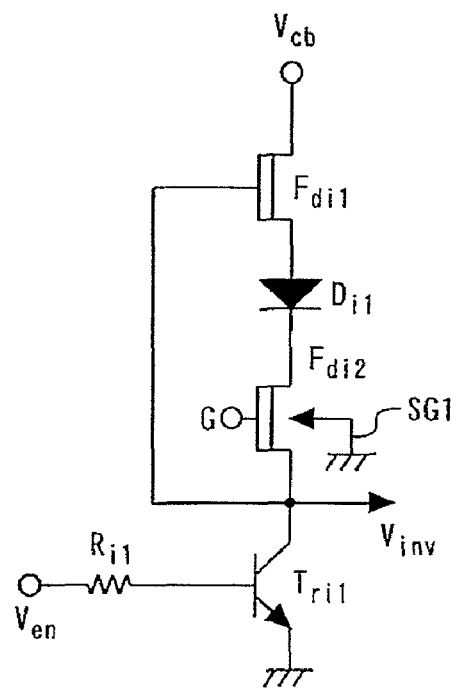
FIG. 29 is a circuit diagram showing an inverter according to the twelfth embodiment.

FIG. 29 is a circuit diagram showing an inverter according to the twelfth embodiment. In this circuit, a side-gate electrode is connected in the vicinity of the FET resistor $F_{di2}$ of the inverter in the second embodiment.

Figure 30:
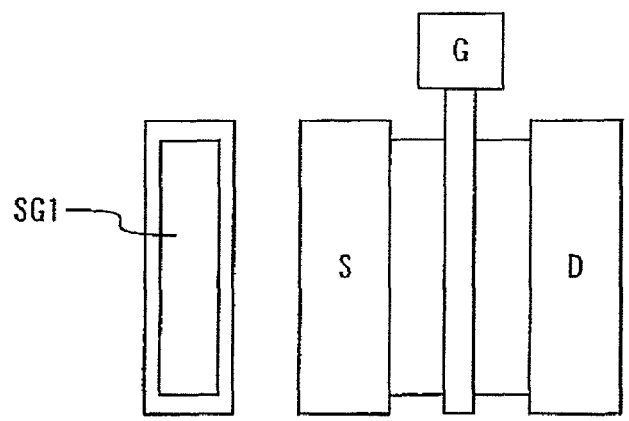
FIG. 30 is a top view showing a FET resistor according to the twelfth embodiment.
Figure 31:
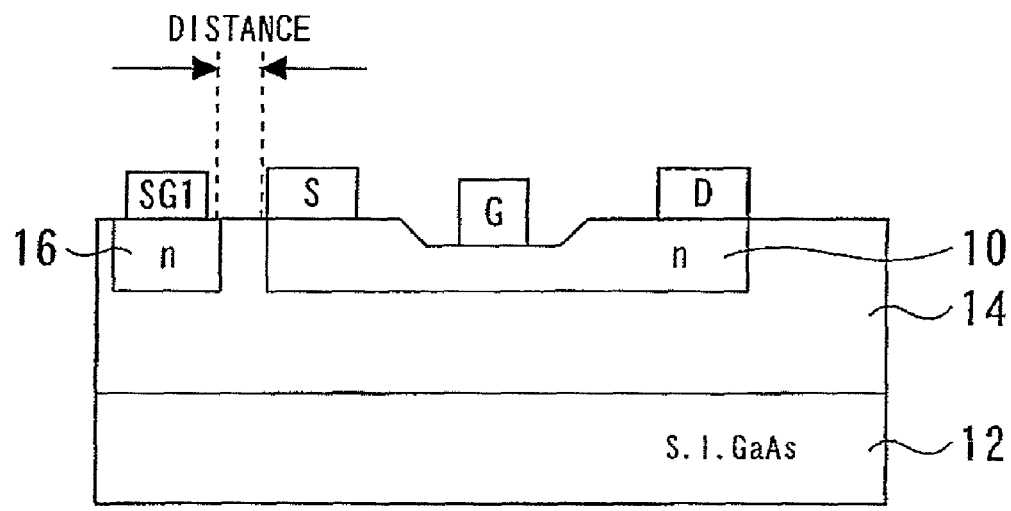
FIG. 31 is a sectional diagram showing the FET resistor according to the twelfth embodiment.

FIG. 30 is a top view showing a FET resistor according to the twelfth embodiment. FIG. 31 is a sectional diagram showing the FET resistor according to the twelfth embodiment. In the vicinity of the FET resistor $F_{di2}$, the side-gate electrode SG1 is connected.

Figure 32:
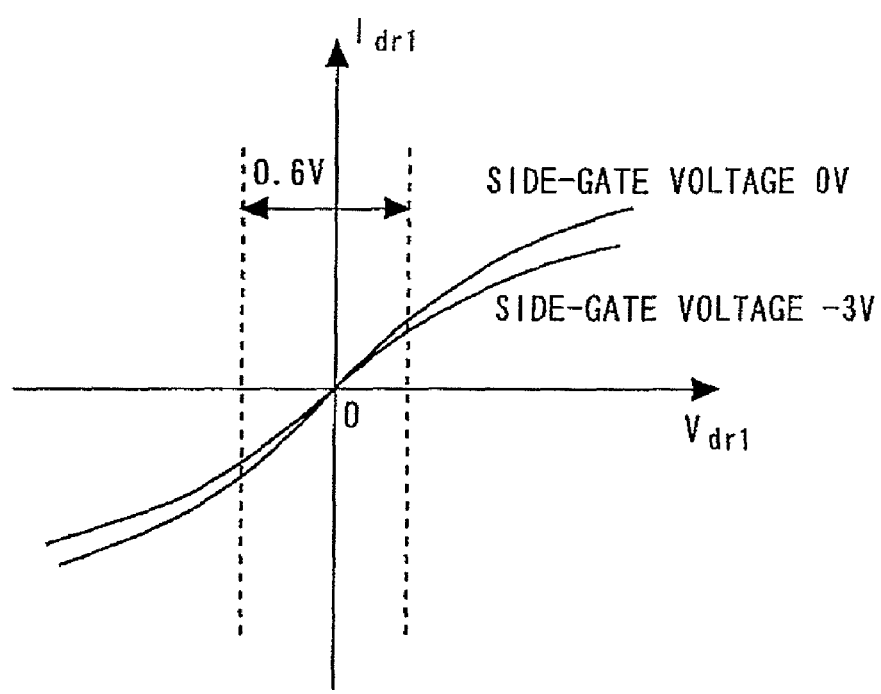
FIG. 32 is a diagram showing the DC characteristics of the FET resistor according to the twelfth embodiment.

FIG. 32 is a diagram showing the DC characteristics of the FET resistor according to the twelfth embodiment. It is known that the resistance value of the FET resistor is different between when the side-gate voltages applied to the side-gate electrode SG1 is 0 V and when it is −3 V. In the process for the epitaxial growth of GaAs buffer layer 14 on a semi-insulating GaAs substrate 12, crystal defects are introduced. The channel resistor of the FET is affected by the side-gate voltage via the level of the crystal defects. Therefore, the resistance value of the FET resistor is different corresponding to the side-gate voltage as described above.

Since the potential of the FET resistor is normally higher than 0 V, if the side-gate voltage is 0 V, the side-gate voltage relatively becomes negative. Thereby, the resistance value of the FET resistor can be elevated, and the layout of the FET resistor can be correspondingly reduced. The effect for elevating the resistance value is about 10 to 30% within the normal voltage range (about 0 to −3 V). In addition, the effect in the second embodiment can also be achieved.

Figure 33:
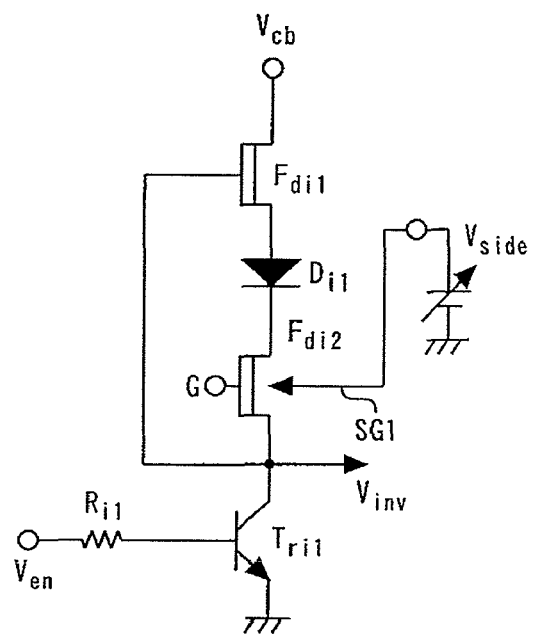
FIG. 33 is a circuit diagram showing a modified example of the inverter according to the twelfth embodiment.

FIG. 33 is a circuit diagram showing a modified example of the inverter according to the twelfth embodiment. The side-gate voltage is made to be variable. Thereby, the resistance value of the FET resistor can be controlled to a desired value after fabricating the chip.

Thirteenth Embodiment

Figure 34:
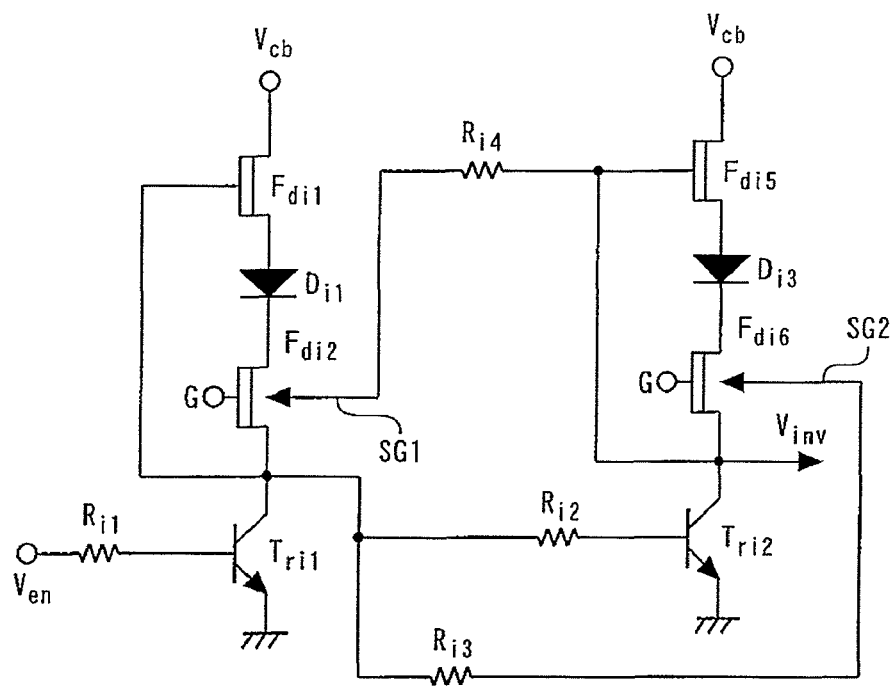
FIG. 34 is a circuit diagram showing an inverter according to the thirteenth embodiment.

FIG. 34 is a circuit diagram showing an inverter according to the thirteenth embodiment. Two stages of inverters are formed. A side-gate electrode SG1 is connected to the vicinity of a FET resistor $F_{di2}$, and a side-gate electrode SG2 is connected to the vicinity of a FET resistor $F_{di6}$. The collector of $Tr_{i1}$ is connected to the side-gate electrode SG2 via a resistor $R_{i3}$, and the collector of $Tr_{i2}$ is connected to the side-gate electrode SG1 via a resistor $R_{i4}$. Thereby, the side-gate voltage can be applied to the FET resistors $F_{di2}$ and $F_{di6}$ without preparing the separate power source.

In addition, since a low side-gate voltage is applied to the FET resistor of the inverter in the OFF state, the FET resistance when the enable voltage is changed from Low to High is slightly elevated. Therefore, although the response time is longer than the case where no side-gate voltage is applied, current consumption can be reduced.

Fourteenth Embodiment

Figure 35:
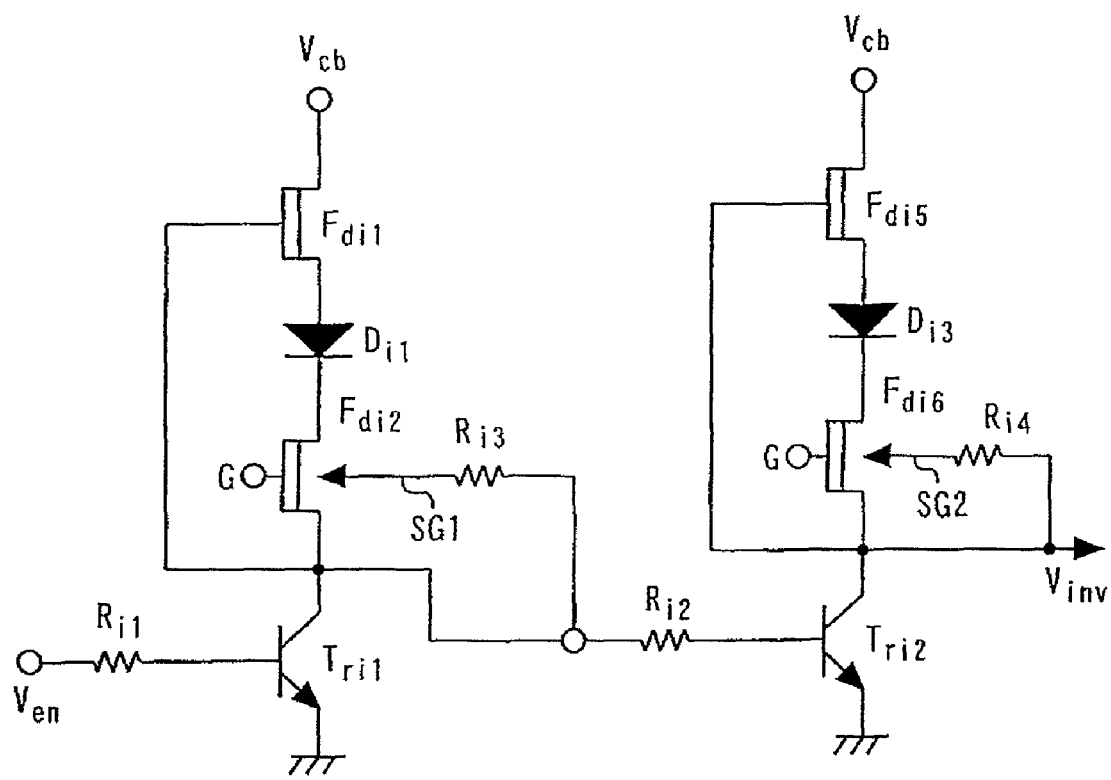
FIG. 35 is a circuit diagram showing an inverter according to the fourteenth embodiment.

FIG. 35 is a circuit diagram showing an inverter according to the fourteenth embodiment. Different from the thirteenth embodiment, the collector of $T_{ri1}$ is connected to a side-gate electrode SG1 via a resistor $R_{ri3}$, and the collector of $T_{ri2}$ is connected to the side-gate electrode SG2 via a resistor $R_{ri4}$. Thereby, in the same manner as in the thirteenth embodiment, the side-gate voltage can be applied to FET resistors $F_{di2}$ and $F_{di6}$ without preparing the separate power source.

Since a low side-gate voltage is applied to the FET resistor of the inverter in the ON state, the FET resistance when the enable voltage is changed from Low to High is slightly lowered. Therefore, although current consumption is increased compared with the case where no side-gate voltage is applied, response time can be shortened.

Fifteenth Embodiment

Figure 36:
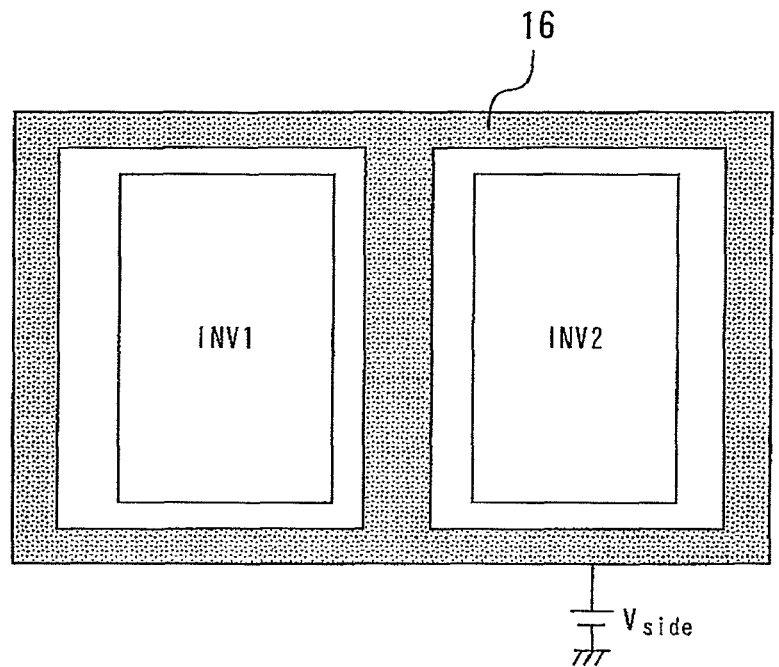
FIG. 36 is a circuit diagram showing an inverter according to the fifteenth embodiment.

FIG. 36 is a circuit diagram showing an inverter according to the fifteenth embodiment. Two-stage inverters INV1 and INV2 are surrounded by a impurity diffused region 16. A side-gate electrode (not shown) is formed on the impurity diffused region 16, and a constant potential is supplied to the impurity diffused region 16. Thereby, the effect of the side-gate voltage from the parts other than the inverters INV1 and INV2 can be prevented. Therefore, operation failure can be prevented, and the effects of manufacturing variation or the chip layout can be reduced.

Figure 37:
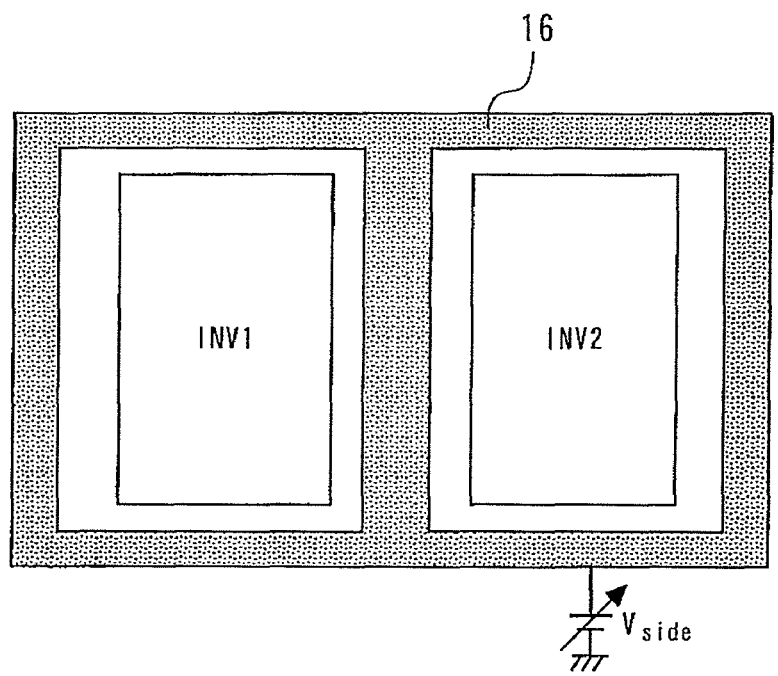
FIG. 37 is a circuit, diagram showing a modified example of the inverter according to the fifteenth embodiment.

FIG. 37 is a circuit diagram showing a modified example of the inverter according to the fifteenth embodiment. The potential supplied to the impurity diffused region 16 is made variable. Thereby, the adequate side-gate voltage corresponding to the power source voltage can be applied to the impurity diffused region 16. For example, the potential of the impurity diffused region 16 is equalized to the highest potential in the circuit (this potential is varied by the external power source voltage).

Sixteenth Embodiment

Figure 38:
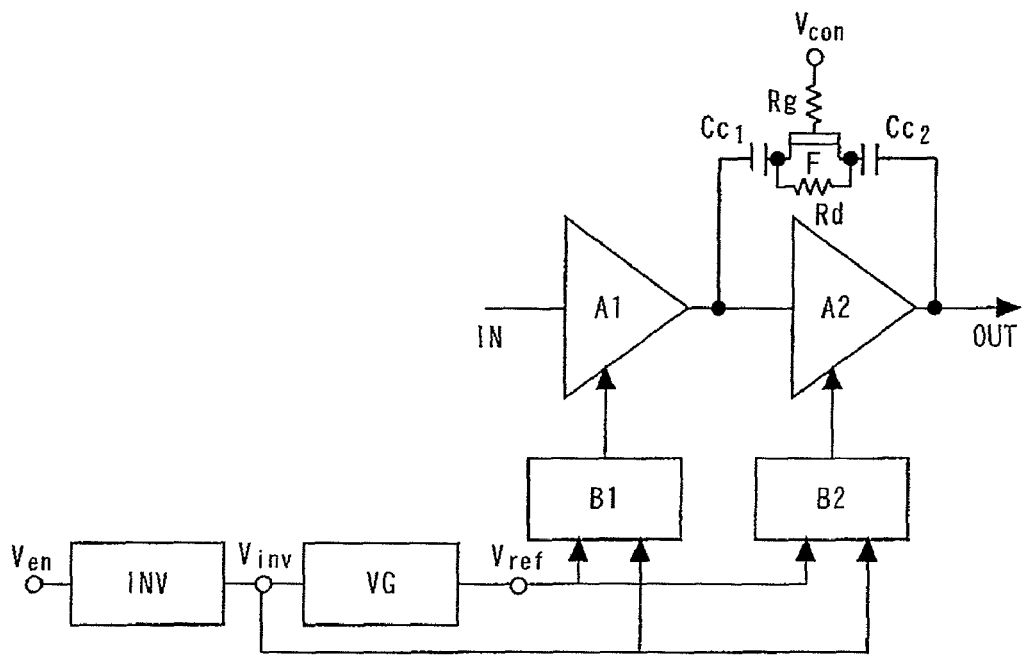
FIG. 38 is a block diagram showing a power amplifier according to the sixteenth embodiment.

FIG. 38 is a block diagram showing a power amplifier according to the sixteenth embodiment. An inverter INV is any inverter in the first to fifteenth embodiments. Corresponding to the output voltage of the inverter INV, not only a reference voltage generating circuit VG, but also a first bias circuit B1 and a second bias circuit B2 are turned ON or OFF.

Figure 39:
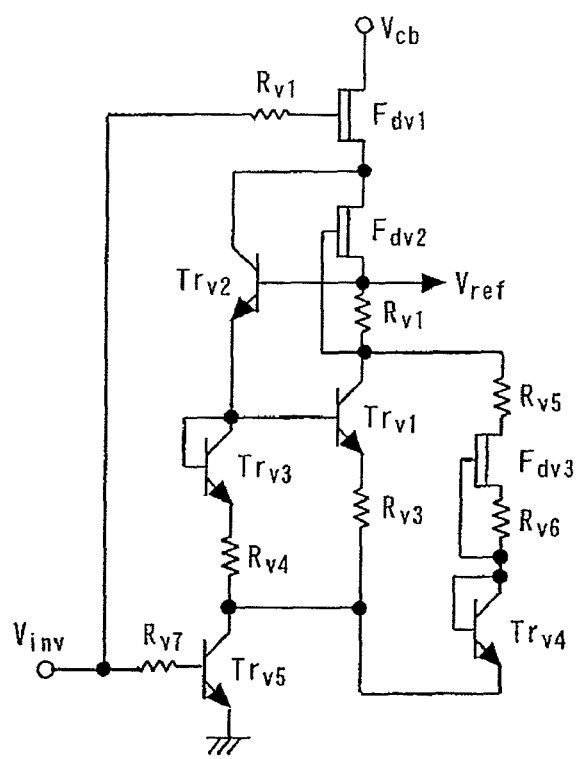
FIG. 39 is a circuit diagram showing a reference voltage generating circuit according to the sixteenth embodiment.

FIG. 39 is a circuit diagram showing a reference voltage generating circuit according to the sixteenth embodiment. In this circuit, a transistor $Tr_{v5}$ and a resistor $R_{v7}$ are added to the reference voltage generating circuit shown in FIG. 2 as a tail-current-switch. $Tr_{v5}$ switches whether the reference voltage generating circuit VG is separated from the grounding point or not corresponding to the output voltage in the inverter INV inputted from a terminal $V_{inv}$ via $R_{v7}$. Thereby, the leakage current of the reference voltage generating circuit when the enable voltage is Low (0 to 0.5 V) is reduced from several tens to several hundreds nA order.

Figure 40:
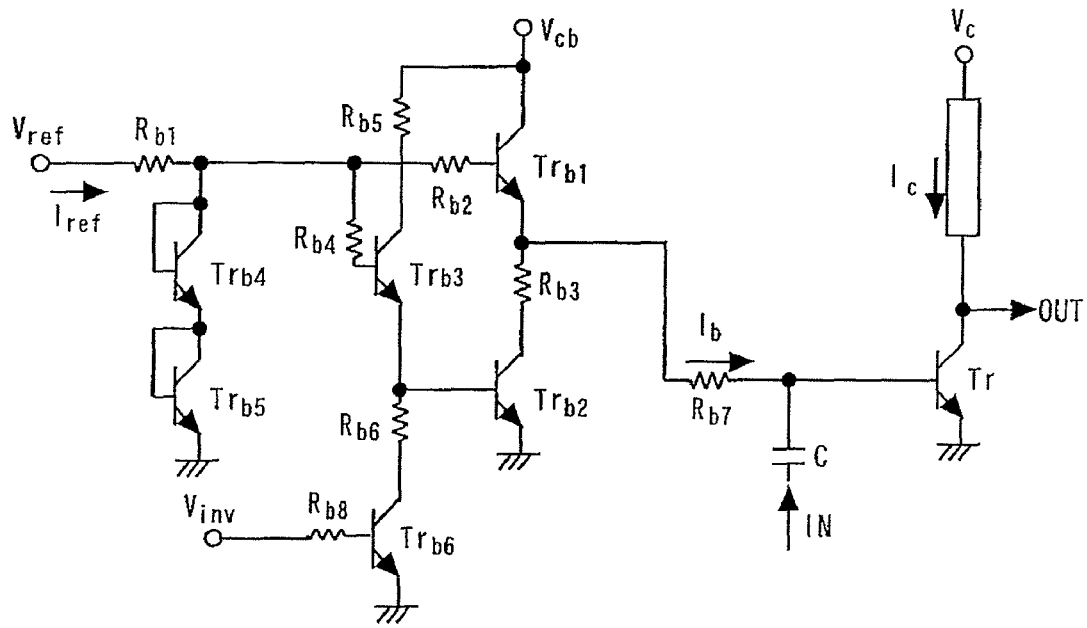
FIG. 40 is a circuit diagram showing a bias circuit according to the sixteenth embodiment.

FIG. 40 is a circuit diagram showing a bias circuit according to the sixteenth embodiment. In this circuit, a transistor $Tr_{b6}$ composed of the HBT and a resistor $r_{b8}$ are added to the bias circuit shown in FIG. 3 as a current-switch. $Tr_{b6}$ switches whether the bias circuit is separated from the grounding point or not corresponding to the output voltage in the inverter INV inputted from the terminal $V_{inv}$ via the resistor $R_{b8}$.

Figure 41:
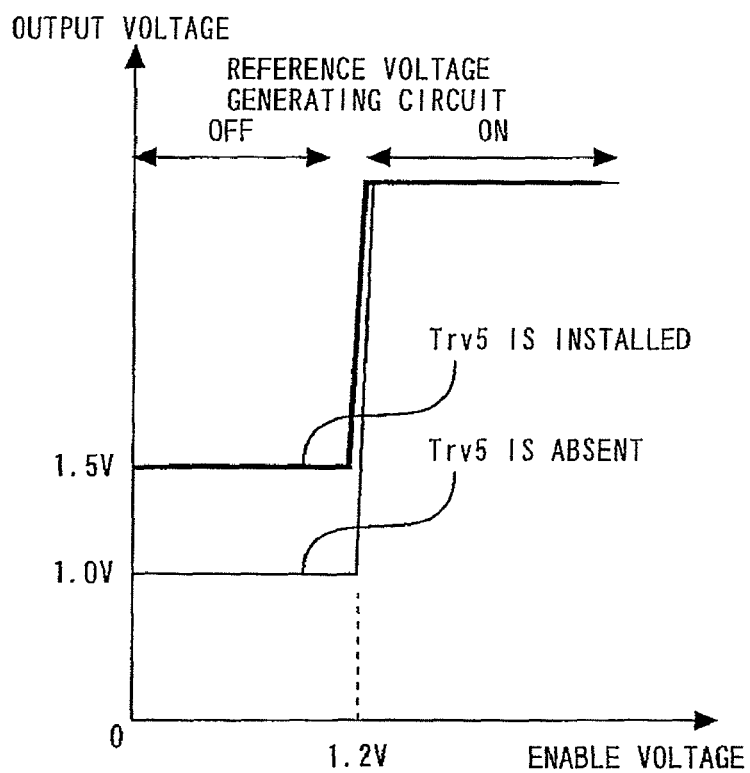
FIG. 41 is a diagram showing the relationship between the output voltage and the enable voltage of the reference voltage generating circuit according to the sixteenth embodiment.

Here, FIG. 41 is a diagram showing the relationship between the output voltage and the enable voltage of the reference voltage generating circuit according to the sixteenth embodiment. When $Tr_{v5}$ is absent in the reference voltage generating circuit, the remaining reference voltage at the time of OFF is 1.0 V. However, the remaining reference voltage when $Tr_{v5}$ is installed is elevated to about 1.5 V. The elevation of the remaining reference voltage at the time of OFF generates the collector leakage current of $T_{rb3}$ in the bias circuit. Therefore, the base potential of $Tr_{b6}$ when the enable voltage is low is made to be about 0 to 0.3 V to turn OFF, the leakage current in the bias circuit can be suppressed.

Figure 42:
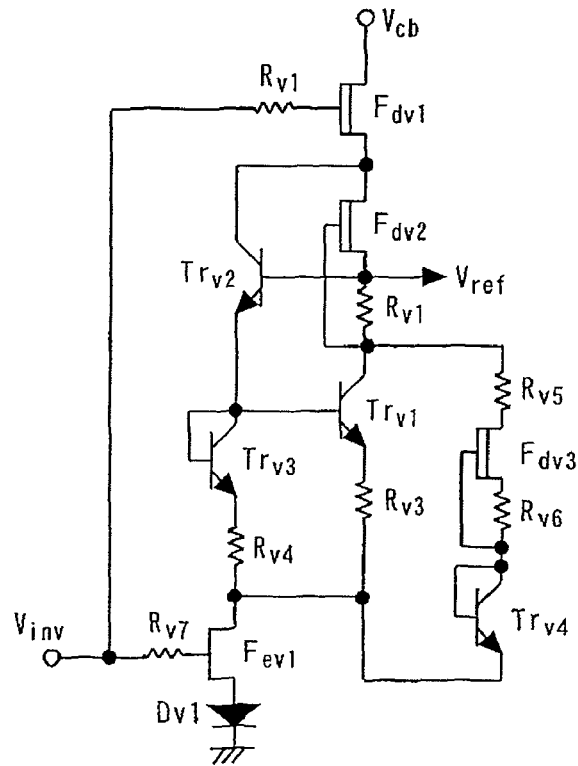
FIG. 42 is a circuit diagram showing a modified example of the reference voltage generating circuit according to the sixteenth embodiment.

FIG. 42 is a circuit diagram showing a modified example of the reference voltage generating circuit according to the sixteenth embodiment. In this circuit, $Tr_{v5}$ of the reference voltage generating circuit shown in FIG. 39 is replaced with an enhancement-mode FET $F_{ev1}$ and a Schottky diode $D_{v1}$. In this case also, the identical effects can be obtained.

Figure 43:
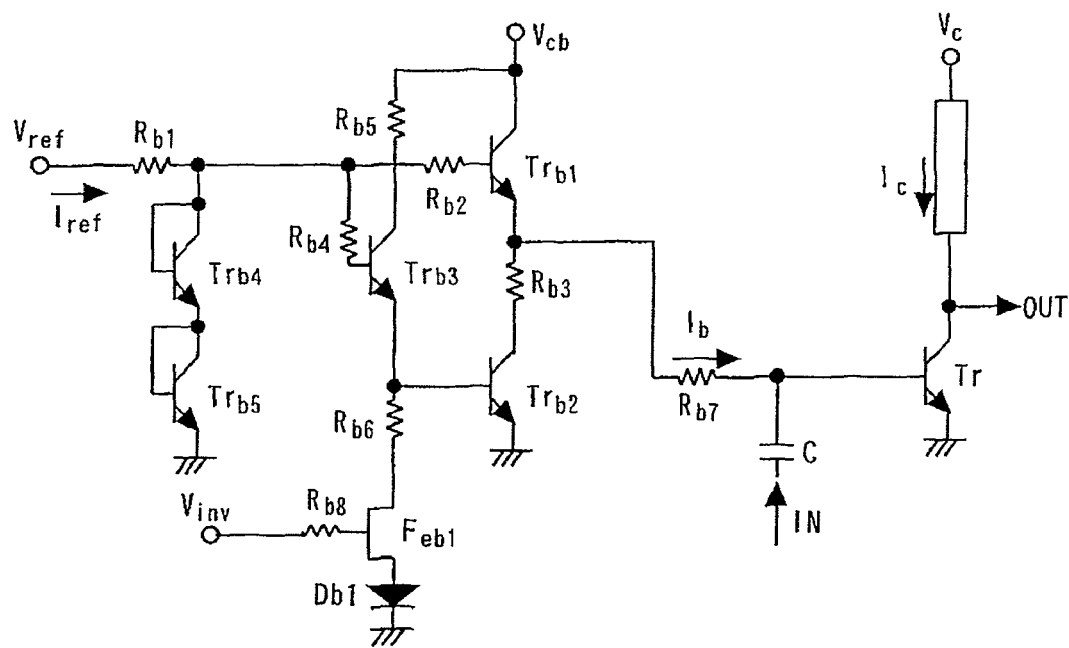
FIG. 43 is a circuit diagram showing a modified example of the bias circuit according to the sixteenth embodiment.
Figure 44:
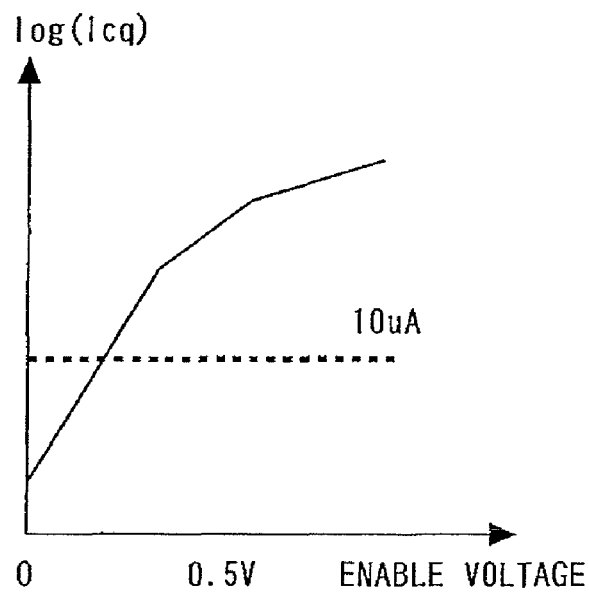
FIG. 44 is a diagram showing the relation between the enable voltage and the leakage current of a power amplifier according to the first reference example.

FIG. 43 is a circuit diagram showing a modified example of the bias circuit according to the sixteenth embodiment. In this circuit, the $Tr_{b6}$ of the bias circuit shown in FIG. 40 is replaced with an enhancement-mode FET $F_{eb1}$ and a Schottky diode $D_{b1}$. In this case also, similar effects can be obtained.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2010-203968, filed on Sep. 13, 2010 including specification, claims, drawings and summary, on which the Convention priority of the present application is based, are incorporated herein by reference in its entirety.

What is claimed is:

1. A power amplifier comprising:
an amplifying transistor for amplifying an input signal;
a reference voltage generating circuit which generates a reference voltage;
a bias circuit generating a bias voltage based on the reference voltage and supplying the bias voltage to the amplifying transistor; and
a booster elevating an enable voltage input from outside and outputting the enable voltage, after boosting, as the output voltage of the booster, wherein
the reference voltage generating circuit is turned ON/OFF corresponding to the output voltage of the booster,
the booster includes:
an enable terminal to which the enable voltage is applied,
a power source terminal connected to a power source,
a transistor having a control electrode connected to the enable terminal, a first electrode connected to the power source terminal, and a second electrode that is grounded, and
a field effect transistor (FET) resistor having a gate electrode and connected between the first electrode of the transistor and the power source terminal, wherein the gate electrode of the FET resistor is open.

2. The power amplifier according to claim 1, further comprising a diode connected between the FET resistor and the power source terminal.

3. The power amplifier according to claim 1, wherein the FET resistor includes two FET resistors connected in series.

4. The power amplifier according to claim 1, wherein the FET resistor has a dual gate.

5. The power amplifier according to claim 1, wherein
the FET resistor includes a plurality of impurity diffused regions located, parallel to each other, on a semiconductor substrate, and gate electrodes in Schottky contact with the plurality of impurity diffused regions, respectively, and
the gate electrodes are joined to each other.

6. The power amplifier according to claim 1, wherein the transistor is an enhancement-mode FET.

7. The power amplifier according to claim 2, wherein the diode includes a diode-connected enhancement-mode FET.

8. The power amplifier according to claim 2, wherein the diode includes two diode-connected enhancement-mode FETs connected in series.

9. The power amplifier according to claim 1, further comprising a back-gate electrode connected immediately under the FET resistor or a side-gate electrode connected proximate the FET resistor, wherein a constant or variable potential is supplied to the back-gate electrode or the side-gate electrode.

10. A power amplifier comprising:
an amplifying transistor for amplifying an input signal;
a reference voltage generating circuit which generates a reference voltage;
a bias circuit generating a bias voltage based on the reference voltage and supplying the bias voltage to the amplifying transistor; and
a booster elevating an enable voltage input from outside and outputting the enable voltage, after boosting, as the output voltage of the booster, wherein
the reference voltage generating circuit is turned ON/OFF corresponding to an output voltage of the booster,
the booster includes:
an enable terminal to which the enable voltage is applied,
a power source terminal connected to a power source,
a first transistor having a control electrode connected to the enable terminal, a first electrode connected to the power source terminal, and a second electrode that is grounded,
a first field effect transistor (FET) resistor having a gate electrode connected between the first electrode of the first transistor and the power source terminal,
a second transistor having a control electrode connected to the first electrode of the first transistor, a first electrode connected to the power source terminal, and a second electrode that is grounded,
a second FET resistor having a gate electrode and connected between the first electrode of the second transistor and the power source terminal,
a first back-gate electrode connected immediately under the first FET resistor or a first side-gate electrode connected proximate the first FET resistor, and
a second back-gate electrode connected immediately under the second FET resistor or a second side-gate electrode connected proximate the second FET resistor, wherein
the gate electrodes of the first and second FET resistors are open,
the first electrode of the first transistor is connected to the second back-gate electrode or the second side-gate electrode, and
the first electrode of the second transistor is connected to the first back-gate electrode or the first side-gate electrode.

11. A power amplifier comprising:
an amplifying transistor for amplifying an input signal;
a reference voltage generating circuit which generates a reference voltage;
a bias circuit generating a bias voltage based on the reference voltage and supplying the bias voltage to the amplifying transistor; and a booster elevating an enable voltage input from outside and outputting the enable voltage, after boosting, as the output voltage of the booster, wherein the reference voltage generating circuit is turned ON/OFF corresponding to an output voltage of the booster, the booster includes:
an enable terminal to which the enable voltage is applied,
a power source terminal connected to a power source,
a first transistor having a control electrode connected to the enable terminal, a first electrode connected to the power source terminal, and a second electrode that is grounded,
a first field effect transistor(FET) resistor having a gate electrode and connected between the first electrode of the first transistor and the power source terminal,
a second transistor having a control electrode connected to the first electrode of the first transistor, a first electrode connected to the power source terminal, and a second electrode that is grounded,
a second FET resistor having a gate electrode and connected between the first electrode of the second transistor and the power source terminal,
a first back-gate electrode connected immediately under the first FET resistor or a first side-gate electrode connected proximate the first FET resistor,
a second back-gate electrode connected immediately under the second FET resistor or a second side-gate electrode connected proximate the second FET resistor, wherein
the gate electrodes of the first and second FET resistors are open,
the first electrode of the first transistor is connected to the first back-gate electrode or the first side-gate electrode, and
the first electrode of the second transistor is connected to the second back-gate electrode or the second side-gate electrode.

12. The power amplifier according to claim 1, further comprising a doped region surrounding the booster, wherein a constant or variable potential is supplied to the doped region.

13. The power amplifier according to claim 1, wherein the reference voltage generating circuit includes a third transistor switching whether the reference voltage generating circuit is separated from a grounding point, corresponding to the output voltage of the booster.

14. The power amplifier according to claim 1, wherein the bias circuit includes a third transistor switching whether the bias circuit is separated from a grounding point, corresponding to the output voltage of the booster.

15. The power amplifier according to claim 13, wherein the third transistor includes an enhancement-mode FET.

16. The power amplifier according to claim 14, wherein the third transistor includes an enhancement-mode FET.

* * * * *